United States Patent
Shiotani

(10) Patent No.: US 8,581,479 B2
(45) Date of Patent: Nov. 12, 2013

(54) LIGHT-EMITTNG DEVICE HAVING A RESIN TO CONTROL DIRECTIVITY TO ENHANCE LUMINOUS EFFICIENCY

(75) Inventor: Toshio Shiotani, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/605,715

(22) Filed: Sep. 6, 2012

(65) Prior Publication Data

US 2013/0154467 A1 Jun. 20, 2013

(30) Foreign Application Priority Data

Dec. 20, 2011 (JP) ................................. 2011-278992

(51) Int. Cl.
*F21V 7/00* (2006.01)

(52) U.S. Cl.
USPC ........... 313/113; 428/480; 362/231; 362/244; 362/245; 313/504; 313/512

(58) Field of Classification Search
CPC ........... H01L 33/56; H01L 33/60; F21K 9/00; G02B 17/868
USPC ............. 257/E33.059, E33.073, 79; 362/231, 362/244–245; 313/502, 503, 512
See application file for complete search history.

(56) References Cited

U.S. PATENT DOCUMENTS

| | | |
|---|---|---|
| 2007/0257267 A1 | 11/2007 | Leatherdale et al. |
| 2008/0137331 A1 | 6/2008 | Kaneko et al. |
| 2008/0152933 A1 | 6/2008 | Mizuno et al. |

FOREIGN PATENT DOCUMENTS

| | | |
|---|---|---|
| JP | 64-034683 | 2/1989 |
| JP | 03-252179 | 11/1991 |
| JP | 6-35265 | 9/1994 |
| JP | 2000-332304 | 11/2000 |

*Primary Examiner* — Tracie Y Green
(74) *Attorney, Agent, or Firm* — Patterson & Sheridan, LLP

(57) ABSTRACT

A light-emitting device includes a first lead frame, a light-emitting element fixed to the first lead frame, and a second lead frame electrically connected via a metal wire to the light-emitting element. In addition, the light-emitting device includes a resin that covers the first lead frame, the light-emitting element, and the second lead frame, and functions as a transmission medium for light emitted from the light-emitting element. The resin has a side surface which is perpendicular to the face to which the light-emitting element has been fixed, and an upper surface. The resin surfaces are configured so that the angle of incidence of a portion of the light emitted from the light-emitting element to the side surfaces is larger than a critical angle needed for total reflection of the light incident on the side surfaces.

20 Claims, 6 Drawing Sheets

LIGHT-EMITTNG DEVICE HAVING A RESIN TO CONTROL DIRECTIVITY TO ENHANCE LUMINOUS EFFICIENCY

CROSS-REFERENCE TO RELATED APPLICATION

This application is based upon and claims the benefit of priority from Japanese Patent Application No. 2011-278992, filed Dec. 20, 2011; the entire contents of which are incorporated herein by reference.

FIELD

Embodiments described herein relate to a light-emitting device.

BACKGROUND

Light-emitting devices are used in various ways, such as for illumination, display, and indication, and providing light directivity suitable for each usage is in demand. For example, in a light-emitting device that has a light-emitting element sealed therein with a resin, a concave and convex shape is rendered to the resin, and the light directivity is controlled by its lens effect. In addition, a method that adds a substance into the resin for diffusing light is also employed. However, a complicated concave and convex shape sometimes lowers the production efficiency in a resin molding process. Moreover, a resin sometimes cannot be molded to the desired concave and convex shape.

DETAILED DESCRIPTION

In general, an example embodiment will be explained with reference to the figures. Here, the same numbers are given to common parts of the figures, and the detailed explanation is appropriately omitted where explained earlier, while new parts are explained. In addition, an XYZ orthogonal coordinates shown in the figures will be referenced, if necessary.

Embodiments disclosed herein provide a light-emitting device, which can control the directivity of light.

In one embodiment, this light-emitting device is provided with a first lead frame, a light-emitting element fixed to the first lead frame, and a second lead frame electrically connected via a metal wire to the light-emitting element. In addition, this light emitting device is provided with a resin that covers the first lead frame, the light-emitting element, and the second lead frame, functions as a transmission medium for light emitted from the light-emitting element, has a side surface which is perpendicular to the face to which the light-emitting element of the first lead frame has been fixed, and an upper surface, where the angle of incidence of a portion of light emitted from the light-emitting element to the side surfaces is larger than a critical angle needed for total reflection of the light.

(Embodiment 1)

Figure 1A:
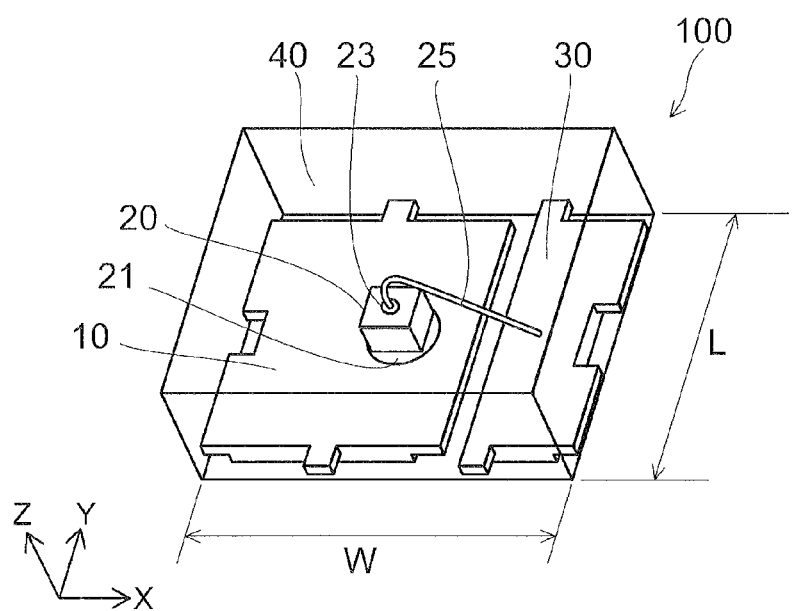
FIGS. 1A and 1B are schematic diagrams of a light-emitting device according to a first embodiment.
Figure 1B:
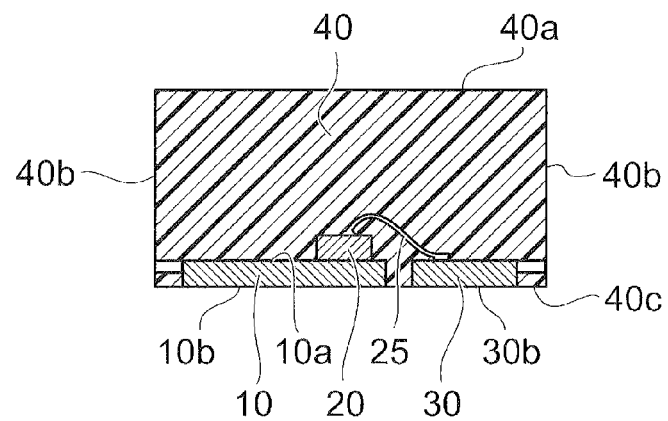

FIGS. 1A and 1B are schematic diagrams showing a light-emitting device 100 of a first embodiment. FIG. 1A is a perspective view showing the appearance of the light-emitting device 100 and FIG. 1B is a cross section schematically showing the light-emitting device 100.

The light-emitting device 100 is provided with first lead frame 10, light-emitting element 20, and second lead frame 30. The light-emitting element 20, for example, is a light-emitting diode (LED).

As shown in FIG. 1A, the light-emitting element 20 is fixed to the first lead frame 10 via a silver (Ag) paste 21, for instance. In addition, the second lead frame 30 is electrically connected via a metal wire 25 to the light-emitting element 20. In other words, a connection is made via the metal wire 25 between an upper electrode 23 of the light-emitting element 20 and the second lead frame 30.

The light-emitting device 100 is further provided with a resin 40 for covering the first lead frame 10, the light-emitting element 20, the second lead 30, and the metal wire 25. The resin 40 functions as a transmission medium for light emitted from the light-emitting element 20. In addition, the resin 40 has four side surfaces 40b which are perpendicular to a face 10a to which the light-emitting element 20 has been fixed, and an upper surface 40a opposite to the face 10a to which the light-emitting element has been fixed.

Moreover, as shown in FIG. 1B, a back face 10b of the first lead frame 10 and a back face 30b of the second lead frame 30 are exposed, as is the lower surface 40c of the resin 40.

The light-emitting device 100 is a surface mount type device, and the back face 10b and the back face 30b of each lead frame, for example, are bonded to a land pattern of a mounting substrate. Next, the device receives a driving current from an external circuit (not shown in the FIGS. 1A and 1B) to cause the light-emitting element 20 to emit light.

Figure 2A:
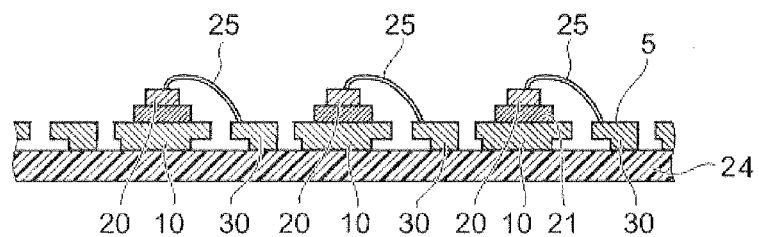
FIGS. 2A to 2C are schematic cross sectional diagrams showing the light-emitting device of the first embodiment.
Figure 2B:
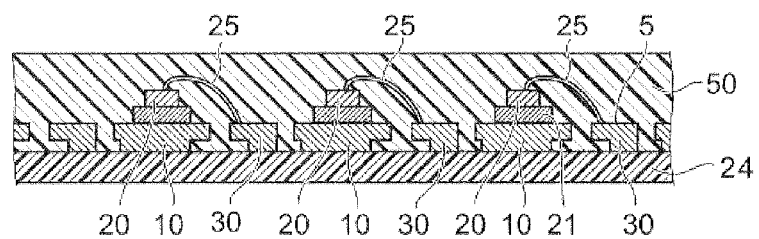
Figure 2C:
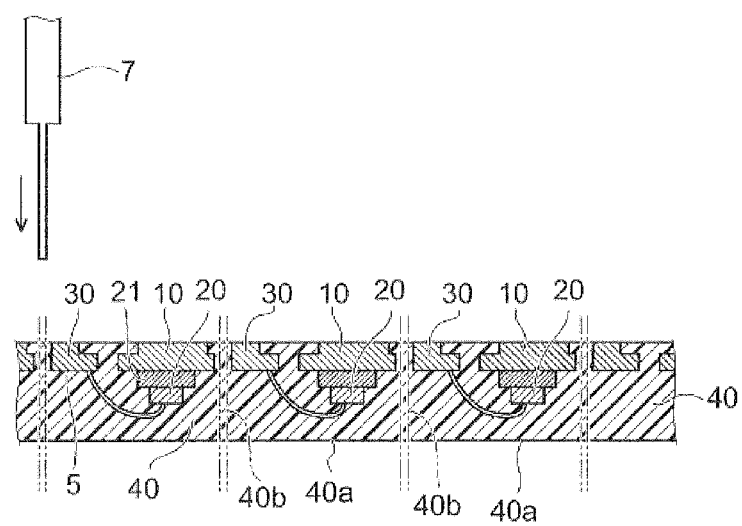

Next, the method for manufacturing the light-emitting device 100 will be explained with reference to FIGS. 2A to 2C. FIGS. 2A to 2C are schematic cross sections showing the manufacturing processes of the light-emitting device 100.

As shown in FIG. 2A, several light-emitting elements 20 are bonded onto a lead frame sheet 5 that includes several first lead frames 10 and second lead frames 30. The light-emitting elements 20 are die-bonded via the Ag paste 21 onto the first lead frames 10. Next, the light-emitting elements 20 and the second lead frames 30 are connected by the metal wires 25.

The lead frame sheet 5, for example, is formed by working a copper plate through an etching method. Next, for example, a reinforcing tape 24 made of a polyimide is pasted on the lower surface of the lead frame sheet 5. Therefore, when the light-emitting elements 20 are die-bonded and when the metal wires 25 are bonded, the strength of the lead frame sheet 5 is secured.

Next, as shown in FIG. 2B, a resin layer 50 is molded on the lead frame sheet 5, on which the light-emitting elements 20 have been mounted, by using a vacuum molding method, for instance. As the resin layer 50, for example, silicone can be used.

Next, as shown in FIG. 2C, the reinforcing tape 24 is peeled off from the lead frame sheet 5, and the lead frame sheet 5 and the resin layer 50 are cut by a dicing blade 7. At that time, as shown in FIG. 2C, dicing may be applied from the back face of the lead frame sheet 5 or from the surface of the resin layer 50.

Therefore, the light-emitting device 100 can be manufactured by a simple method without using an exclusive mold. In addition, the light-emitting device 100 has an upper surface 40a and four side surfaces 40b that have been formed by the dicing blade 7. Each side surface 40b is formed perpendicularly to the plane including the face 10a on which the light-emitting elements 20 have been fixed.

Next, the characteristic of the light-emitting device 100 will be explained with reference to FIGS. 3A to 3C and 4.

Figure 3A:
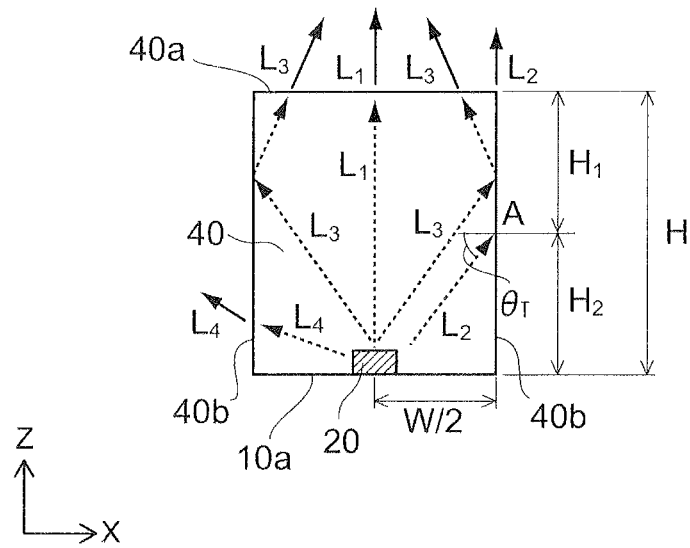
FIGS. 3A to 3C are schematic cross sectional diagrams showing the characteristic of the light-emitting device of the first embodiment.
Figure 3B:
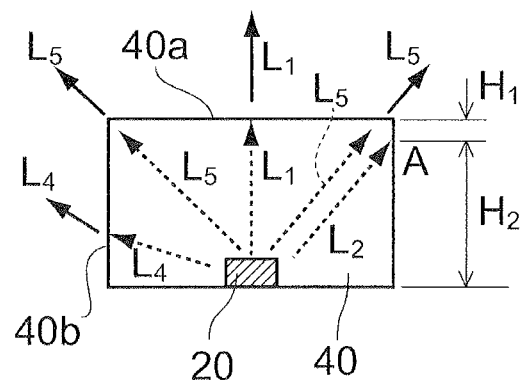
Figure 3C:
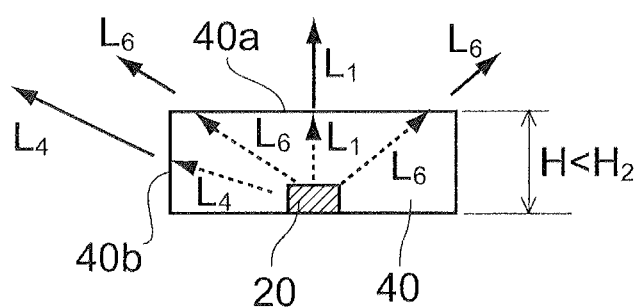

FIGS. 3A to 3C each show the propagating directions of light that are emitted from the light-emitting elements 20, and a different height H of the resin 40 in the Z direction.

FIG. 3A shows the case in which the height of the resin 40 is higher than that of the example shown in FIG. 3B and reflection of light occurs on the side surfaces of the resin 40. As shown, light $L_1$ is emitted from the light-emitting element 20, propagates towards the upper surface 40a of the resin 40 and is emitted to the outside. On the other hand, light propagating towards the side surfaces 40b includes light $L_3$, which is totally reflected at the interface of the resin 40 and the outside, and light $L_4$, which is emitted to the outside through the interface of the resin 40 and the outside.

Further shown in FIG. 3A is the angle of incidence on the side surface 40b of light $L_2$ that is known as the critical angle $\theta_T$ for total reflection. The light $L_2$ is incident on the side surface 40b, propagates upward (Z direction) along the side surface 40b, and is emitted to the outside. In addition, the light $L_3$ incident at an angle larger than the light $L_2$ on the side surface 40b is totally reflected by the side surface 40b and emitted to the outside from the upper surface 40a. On the other hand, the light $L_4$ incident at an angle of incidence smaller than the light $L_2$ on the side surface 40b is emitted to the outside through the interface of the resin 40 and the outside.

In other words, light incident on the side surface 40b at a position between a plane including the face 10a, to which the light-emitting element 20 has been fixed, and below point A where the light $L_2$ is incident on the side surface 40b, passes through the interface of the resin 40 and the outside. On the other hand, light incident on the side surface 40b at a position between point A and the upper surface 40a is totally reflected at the interface of the resin 40 and the outside, and emitted to the outside from the upper surface 40a.

Here, the critical angle for total reflection depends upon the refractive index of an external medium surrounding the resin 40. Therefore, when the light-emitting device 100 is used in air, the critical angle for total reflection may be defined with air as the external medium. In addition, when the external medium surrounding the resin 40 has a refractive index different from that of air (for example, the external medium surrounding the resin 40 is a gas different from air or a liquid, fluid, solid, etc.), the critical angle for total reflection can be defined using the corresponding refractive index.

In this specification, when the medium surrounding the resin 40 or its refractive index is known, the critical angle for total reflection corresponding to the refractive index of the medium is defined. In case the medium surrounding the resin 40 is not known, the critical angle for total reflection defined for air may be utilized.

If the gap $H_1$ between point A and the upper surface 40a is widened by increasing the height H of the resin 40, light with a small angle of incidence on the upper surface 40a among the light $L_3$ that is totally reflected by the side surface 40b increases. In other words, for light that is totally reflected at higher positions of the side surface 40b, the angle of incidence on the upper surface 40a becomes smaller. For this reason, the ratio of light emitted upward (Z direction) increases, narrowing the directivity of light being emitted from upper surface 40a.

On the other hand, as shown in FIG. 3B, if $H_1$ is narrowed by reducing the height H of the resin 40, the angle of incidence of the light that is totally reflected by the side surface 40b on the upper surface 40a becomes large. In addition, light $L_5$ with a large angle of incidence is generated among the light that is directly incident on the upper surface 40a. For this reason, the amount of light having a propagation component in the horizontal direction (X direction) increases, widening the directivity of light being emitted from upper surface 40a.

Moreover, as shown in FIG. 3C, if the height H of the resin 40 is lower than point A, total reflection does not occur on the side surface 40b. Therefore, light incident on the side surface 40b (e.g., light $L_4$) is emitted in a horizontal direction through the interface of the resin 40 and the outside. In addition, among the light directly incident on the upper surface 40a, light $L_6$ with an angle of incidence larger than that of the light $L_5$ (shown in. FIG. 3B) is generated, further widening the directivity of light emitted from upper surface 40a.

Therefore, in the light-emitting device 100 of this embodiment, the directivity of emitted light is controlled by changing the height H of the resin 40. For example, to narrow the directivity of emitted light, the height of the resin 40 is set so that it is higher than point A. At least in the parts in which the side surfaces 40b and the upper surface 40a are intersected, the angle of incidence of light emitted from the light-emitting element 20 on the side surfaces 40b is set so that it is larger than the critical angle $\theta_T$ for total reflection on the side surfaces. In other words, the condition of the following expression (1) may be met.

$$\tan \theta_T \leq 2H/W \text{ or } 2H/L \tag{1}$$

Where W represents the width in the X direction of the resin 40 and L represents the width in the Y direction of the resin 40.

Furthermore, the gap $H_1$ between point A and the upper surface 40a may be wider than the gap $H_2$ between point A and the plane including the face 10a to which the light-emitting element 20 has been fixed. In other words, the width in the Z direction of the part that totally reflects light of the light-emitting element 20 in the side surface 40b may be wider than the width in the Z direction of the part through which light from the light-emitting element 20 is emitted.

Figure 4:
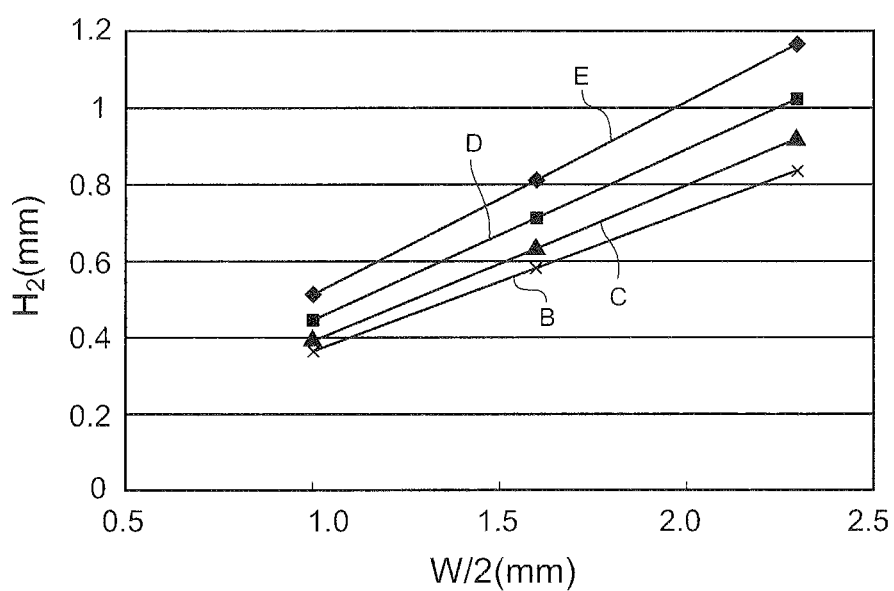
FIG. 4 is a graph showing characteristics of the light-emitting device of the first embodiment.

FIG. 4 is a graph showing the gap $H_2$ between point A and the plane which includes the face 10a. The abscissa indicates a horizontal distance between the side surface 40b of the resin 40 and the center of the light-emitting element 20. For example, if the light-emitting element 20 is arranged at the center of the lower surface 40c of the resin 40 and the width in the X direction of the resin 40 is assumed as W, the abscissa is W/2. The width L in the Y direction can also be similarly indicated.

Lines B, C, D, and E show the case in which the refractive index of the resin 40 is 1.8, 1.6, 1.5, and 1.4, respectively. In addition, the critical angle $\theta_T$ for total reflection corresponding to these refractive indexes is 36.8°, 38.68°, 41.81°, and 45.58°, respectively. The higher the refractive index, the smaller the critical angle ($\theta_T$) for total reflection, and the narrower the $H_2$. Moreover, as the width W of the resin 40 is widened, $H_2$ becomes wider.

As described above, to narrow the directivity of the light-emitting device 100, $H_1$ to $H_2$ may be widened by increasing the overall height (H) of the resin. In other words, the height H of the resin 40 may be increased, or the width W in the X direction and the width L in the Y direction may be narrowed. In addition, both of these techniques may be applied to increase the directivity. As an additional technique, if either the width W in the X direction or the width L in the Y direction is reduced so that one width is less than the other, the directivity along a particular direction can be more narrowed.

Furthermore, in order to narrow the directivity, the refractive index of the resin 40 may be increased. For example, the material of the resin 40 may be a resin with a high refractive index. In addition, the resin 40 may also include a substrate, through which light that is emitted from the light-emitting element 20 is transmitted, and a material for raising the refractive index of the substrate may be used. For example, silica may be included in a silicone substrate. Moreover, silica may be included in an epoxy resin substrate.

On the other hand, to widen the directivity of the light-emitting device 100, $H_1$ to $H_2$ may be narrowed, or the height of the resin 40 may be set so that it is lower than $H_2$. In other words, the height of the resin 40 may be lowered, and the width W in the X direction and the width L in the Y direction may be widened. In addition, the refractive index of the resin 40 may be lowered.

Figure 5A:
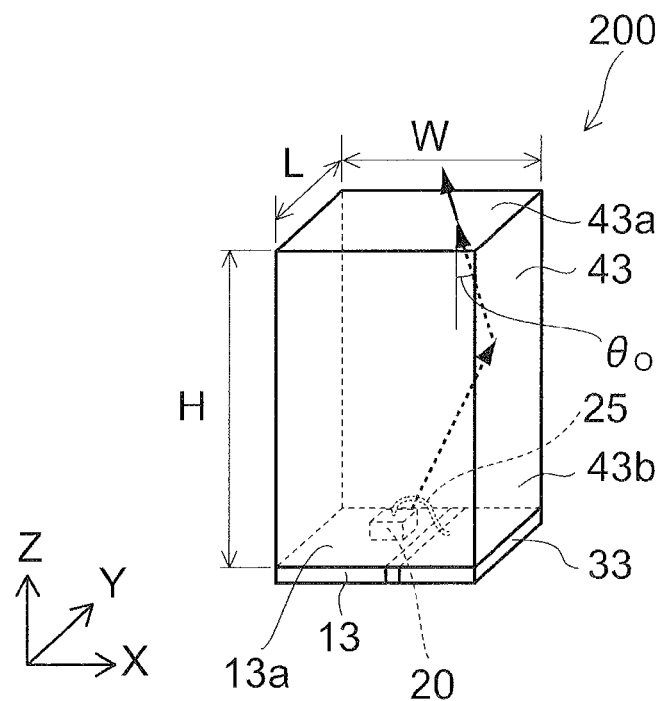
FIGS. 5A and 5B are schematic diagrams showing a modified light-emitting device of the first embodiment.
Figure 5B:
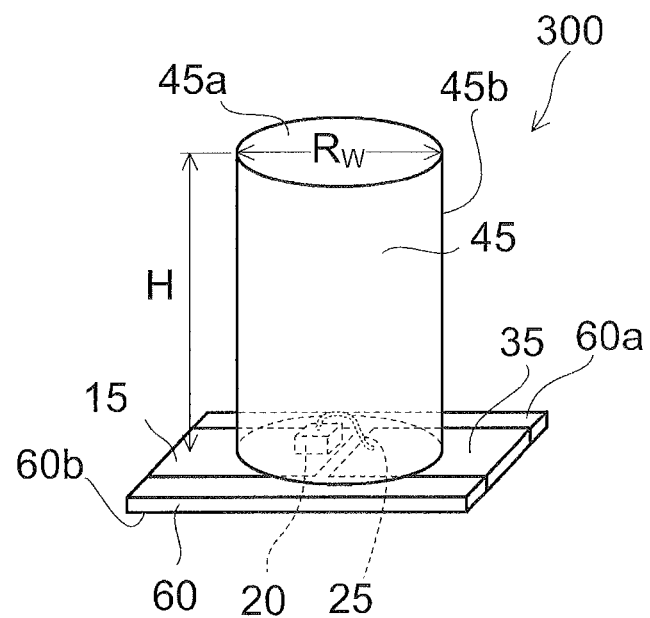

FIGS. 5A and 5B are schematic diagrams showing the light-emitting device corresponding to a modified example of the first embodiment. FIG. 5A is a perspective view of a light-emitting device 200. FIG. 5B is a perspective view of a light-emitting device 300.

The light-emitting device 200 shown in FIG. 5A is provided with first lead frame 13, light-emitting element 20, and second lead frame 33. The light-emitting element 20, for example, is an LED and is fixed to the first lead frame 13. In addition, the second lead frame 33 is electrically connected to the light-emitting element 20 via metal wire 25.

The light-emitting device 200 is further provided with a resin 43 for covering the first lead frame 13, light-emitting element 20, second lead frame 33, and metal wire 25. The resin 43 is a transmission medium for light emitted from the light-emitting element 20 and has four side surfaces 43b perpendicular to the face 13a, to which the light-emitting element 20 of the first lead frame 13 has been fixed, and an upper surface 43a opposite to the face 13a to which the light-emitting element 20 has been fixed.

The height H in the Z direction of the resin 43, for example, is higher than the width W in the X direction and the width L in the Y direction. Here, the height H of the resin 43 is a gap between the face 13a, to which the light-emitting element 20 has been fixed, and the upper surface 43a. Therefore, the angle θo of incidence of light incident on the upper surface 43a is decreased as the height H is increased, thus being able to narrow the directivity. In other words, light emitted from the light-emitting element 20 can be directed in the Z direction through the resin 43. Therefore, the optical output that is emitted in the Z direction from the upper surface 43a is raised, thus being able to narrow the directivity.

The light-emitting device 300 shown in FIG. 5B is provided with a base 60, light-emitting element 20 fixed onto the base 60, and resin 45.

The base 60 is an insulating plate; on its surface, for example, lead frames 15 and 35 with electric conductivity are installed with a separation. The light-emitting element 20 is fixed to the surface of the lead frame 15. In addition, the lead frame 35 and the light-emitting element 20 are electrically connected via the metal wire 25. The lead frame 15 and the lead frame 35, for example, are connected to an external circuit (not shown) on a back face 60b of the base 60.

The resin 45 covers the light-emitting element 20 and a portion of the base 60 and functions as a transmission medium for light emitted from the light-emitting element 20. In addition, the resin 45 has a face 45b perpendicular to a face 60a, to which the light-emitting element 20 of the base 60 has been fixed, and an upper surface 45a opposite to the face 60a of the base 60. Moreover, the angle of incidence of light emitted from the light-emitting element 20 to the side surface 45b is larger than the critical angle of the total reflection.

The resin 45 has a cylindrical shape and can be easily formed by injection molding, for instance. The shape of the upper surface 45a is circular, and the light-emitting element 20 is arranged at the center of the lower surface. The height H of the resin 45 is greater than the diameter Rw of the upper surface 45a.

Light of the light-emitting element 20 is directed in the Z direction while being totally reflected by the side surface 45b of the resin 45 and emitted to the outside from the upper surface 45a. For this reason, the directivity of the light emitted from the upper surface 45a becomes strong in the Z direction and is isotropic in the XY plane.

Furthermore, in the light-emitting device 200 of this modified example, the width in the Z direction of the part in which the light emitted from the light-emitting element 20 is totally reflected by the side surface 43b is wider than the width in the Z direction of the part in which the light emitted from the light-emitting element 20 is transmitted through the upper surface 43a. A light-emitting device 300 is also similarly operated. In addition, the resins 43 and 45 may include a material for raising the refractive index of its substrate.

(Embodiment 2)

Figure 6:
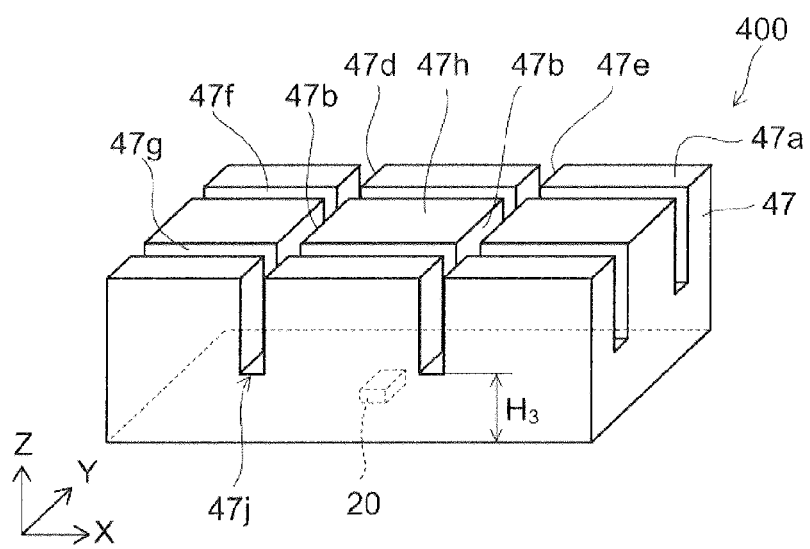
FIG. 6 is a schematic diagram of a light-emitting according to a second embodiment.

FIG. 6 is a perspective diagram schematically showing a light-emitting device 400 of a second embodiment. The light-emitting device 400 is provided with light-emitting element 20, first lead frame 10, and second lead frame 30. In addition, this device is further provided with a resin 47 for covering the light-emitting element 20, first lead frame 10, and second lead frame 30. In FIG. 6, for simplicity, the first lead frame 10 and the second lead frame 30 are not shown (see FIGS. 1A and 1B for depiction of these elements).

In the light-emitting device 400, several grooves 47d, 47e, 47f, and 47g are formed on an upper portion of the resin 47. The grooves 47d-47g, for example, can be formed by cutting the resin 47 halfway using a dicing blade. The grooves 47d and 47e are parallel in the X and Y directions and cut in the X and Y directions. In addition, a part including the upper surface 47h and four side surfaces 47b which are adjacent to the upper surface, is formed at the center of the resin 47. The resin 47 may include a material for raising the refractive index of its substrate.

The light-emitting element 20 is arranged opposite to the upper surface 47h at the center of the lower surface of the resin 47. Moreover, a gap $H_3$ between bottom faces of the grooves 47d-47g and a surface to which the light-emitting element 20 has been fixed is the same as or smaller than $H_2$ shown in FIGS. 3A to 3C). Therefore, light that is emitted from the light-emitting element 20, and propagating toward the side surface 47b is totally reflected by the side surface 47b and is propagated toward the upper surface 47a after reflection. For this reason, the optical output in the Z direction is improved, narrowing the directivity.

Figure 7A:
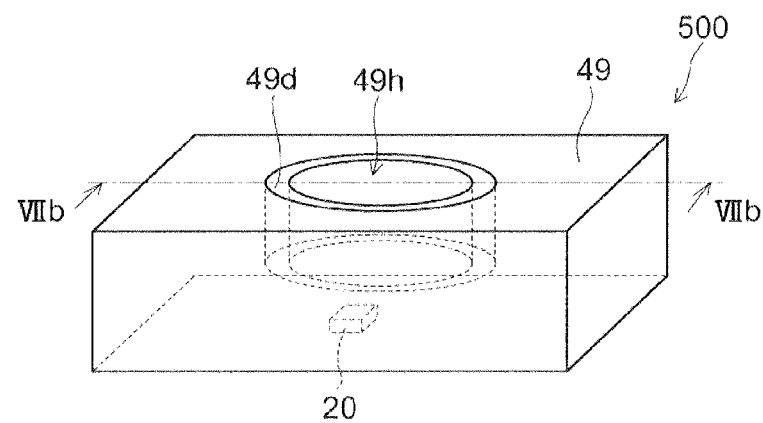
FIGS. 7A and 7B are schematic diagrams a modified light-emitting device of the second embodiment.
Figure 7B:
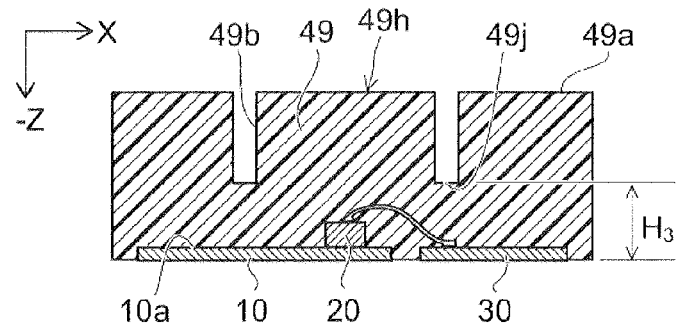

FIGS. 7A and 7B are schematic diagrams showing a light-emitting device 500 of a modified example of the second embodiment. FIG. 7A is a perspective view schematically showing the light-emitting device 500 and FIG. 7B is a cross section taken along line VIIb-VIIb of FIG. 7A.

The light-emitting device 500 is provided with light-emitting element 20, first lead frame 10 (shown in FIG. 7B only), and second lead frame 30 (shown in FIG. 7B only). In addition, this device is further provided with a resin 49 for covering the light-emitting element 20, first lead frame 10, second lead frame 30, and lower face 10a on which the light-emitting element is mounted.

At a center portion of the upper surface 49a of the resin 49, a circular groove 49d is formed. The groove 49d, for example, can be easily formed by the injection molding method. The resin 49 may include a material for raising the refractive index of its substrate. The shape of the groove is not limited to the circular shape and may be an elliptic shape or polygonal shape, for instance.

The light-emitting element 20 is arranged at the center of the lower surface of the resin 49 opposite to the center of the circular upper surface 49h. In addition, a gap $H_3$ between the bottom face 49j of the groove 49d and a plane including the face 10a, to which the light-emitting element 20 has been fixed, is the same as or smaller than $H_2$ (see FIGS. 3A to 3C). Therefore, the light emitted from the light-emitting element 20 propagates towards the side surface 49b, is totally reflected by the side surface 49b and then propagates towards the upper surface 49h. For this reason, the optical output in the Z direction is improved, narrowing the directivity.

In this embodiment, for example, the optical output in the Z direction is improved without reducing the size of the light-emitting devices 400 and 500, thus being able to narrow the directivity. This light-emitting device is effective for the case in which the size of the light-emitting is difficult to be reduced, for example, in the case in which the size in the XY plane is fitted to the land pattern of a mounting substrate, etc. In addition, this device is also effective for the case in which the height H of the resin 47 cannot be raised because of the limitation of the mounting space.

While certain embodiments have been described, these embodiments have been presented by way of example only, and are not intended to limit the scope of the invention. Indeed, the novel embodiment described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A light-emitting device, comprising:
   a first lead frame;
   a light-emitting element fixed to the first lead frame;
   a second lead frame electrically connected to the light-emitting element; and
   a resin that covers the first lead frame, the light-emitting element, and the second lead frame, and has a side surface perpendicular to a face of the first lead frame to which the light-emitting element is fixed, where the angle of incidence of a portion of light emitted from the light-emitting element to the side surfaces is larger than the critical angle for total reflection at the side surface.

2. The device of claim 1, wherein the portion of light emitted from the light-emitting element to the side surfaces which has an angle of incidence larger than the critical angle for total reflection at the side surface is greater than a portion of light emitted from the light-emitting element to the side surfaces which has an angle of incidence smaller than the critical angle for total reflection at the side surface.

3. The device of claim 2, wherein the thickness of the resin above a point on the side surface, above which light reflected at the side surface is totally reflected, is greater than the thickness of the resin below the point.

4. The device of claim 3, wherein the resin has one or more grooves formed through an upper surface thereof, and the grooves extend down to a position that is at a height of the point.

5. The device of claim 4, wherein the one or more grooves include linear grooves that are equally spaced apart.

6. The device of claim 4, wherein the one or more grooves include a circular groove.

7. The device of claim 1, wherein the resin is made of material that has a refractive index that causes total reflection of the portion of light emitted from the light-emitting element at the side surface.

8. The device of claim 1, wherein an upper surface of the resin is parallel to the face of the first lead frame and perpendicular to the side surface.

9. The device of claim 1, wherein wires connect the light-emitting element to the first lead frame and the second lead frame, and the wires are covered by the resin.

10. The device of claim 1, wherein the resin has one or more equally spaced apart linear grooves or circular grooves formed through an upper surface thereof.

11. A light-emitting device, comprising:
    a base;
    a light-emitting element fixed to a face of the base; and
    a resin that covers the base and the light-emitting element, and has a side surface perpendicular to the face and an upper surface perpendicular to the side surface through which a majority of light emitted from the light-emitting element is transmitted after being totally reflected by the side surface.

12. The light-emitting device of claim 11, wherein
    the thickness of the resin above a point at which light emitted from the light-emitting element is totally reflected by the side surface is larger than the thickness of the resin below the point.

13. The light-emitting device of claim 11, wherein
    the resin includes a substrate that raises the refractive index of the resin.

14. The light-emitting device of claim 11, wherein
    the resin has four side surfaces perpendicular to the face of the base.

15. The light-emitting device of claim 11, wherein
    the resin has a cylindrical surface perpendicular to the face of the base.

16. A light-emitting device, comprising:
    a base;
    a light-emitting element fixed to a face of the base; and
    a resin that covers the base and the light-emitting element, the resin having at least one groove extending through an upper surface thereof to form side surfaces that are perpendicular to the face,
    wherein the angle of incidence of light emitted from the light-emitting element and reflected by the side surfaces are greater than the critical angle for total reflection at the side surfaces.

17. The light-emitting device of claim 16, wherein the at least on groove includes linear grooves that are spaced apart equally.

18. The light-emitting device of claim 16, wherein the at least on groove includes a circular groove.

19. The light-emitting device of claim 16, wherein the base includes a first lead frame to which the light-emitting element is fixed and a second lead frame that is physically separate from the first lead frame.

20. The light-emitting device of claim 19, wherein wires connect the light-emitting element to the first lead frame and the second lead frame, and the wires are covered by the resin.

* * * * *